(12) United States Patent
Kim et al.

(10) Patent No.: US 8,558,268 B2
(45) Date of Patent: Oct. 15, 2013

(54) LIGHT EMITTING DIODE PACKAGE

(75) Inventors: Hyung Kun Kim, Suwon (KR); Ho Sun Paek, Suwon (KR); Suk Ho Jung, Hwaseong (KR); Jeong Wook Lee, Yongin (KR)

(73) Assignee: Samsung Electronics Co., Ltd., Seoul (KR)

( * ) Notice: Subject to any disclaimer, the term of this patent is extended or adjusted under 35 U.S.C. 154(b) by 799 days.

(21) Appl. No.: 12/343,452

(22) Filed: Dec. 23, 2008

(65) Prior Publication Data

US 2010/0128461 A1   May 27, 2010

(30) Foreign Application Priority Data

Nov. 27, 2008 (KR) .................. 10-2008-0119189

(51) Int. Cl.
*H01L 33/00* (2010.01)
(52) U.S. Cl.
USPC ........ 257/99; 257/79; 257/100; 257/E33.059; 257/E31.129
(58) Field of Classification Search
USPC ............... 257/79, 88, 99, E33.059, E33.058, 257/E33.001, E33.056, E33.072, E23.087, 257/94–103, 59, 72, E33.061, E31.129; 438/22, 110, 112, 317; 313/483, 501, 313/512
See application file for complete search history.

(56) References Cited

U.S. PATENT DOCUMENTS

| | | | |
|---|---|---|---|
| 6,393,238 B1 * | 5/2002 | Hashimoto et al. ........... | 399/175 |
| 6,600,175 B1 | 7/2003 | Baretz et al. | |
| 7,547,114 B2 * | 6/2009 | Li et al. ......................... | 362/231 |
| 7,834,854 B2 * | 11/2010 | Kim .............................. | 345/170 |
| 7,906,789 B2 * | 3/2011 | Jung et al. ........................ | 257/89 |
| 2002/0047516 A1 * | 4/2002 | Iwasa et al. .................... | 313/512 |
| 2003/0038295 A1 * | 2/2003 | Koda .............................. | 257/98 |
| 2003/0067773 A1 * | 4/2003 | Marshall et al. ............... | 362/231 |
| 2003/0209982 A1 * | 11/2003 | Kim et al. ...................... | 313/584 |
| 2004/0234417 A1 * | 11/2004 | Schienle et al. ........... | 422/82.08 |
| 2005/0151094 A1 * | 7/2005 | Kitagawa ..................... | 250/458.1 |
| 2006/0083281 A1 * | 4/2006 | Inoguchi .................... | 372/50.12 |
| 2006/0105485 A1 * | 5/2006 | Basin et al. ..................... | 438/27 |
| 2006/0138435 A1 * | 6/2006 | Tarsa et al. ...................... | 257/89 |
| 2006/0221637 A1 | 10/2006 | Chikugawa et al. | |
| 2006/0274284 A1 * | 12/2006 | Peterson et al. ................. | 353/84 |
| 2007/0211449 A1 * | 9/2007 | Holman et al. ................. | 362/19 |

FOREIGN PATENT DOCUMENTS

| | | | |
|---|---|---|---|
| JP | 2006-286935 A | 10/2006 | |
| JP | 2008-060129 | 3/2008 | |
| JP | 2008-108835 A | 5/2008 | |
| JP | 2008-140934 A | 6/2008 | |

* cited by examiner

*Primary Examiner* — Cuong Q Nguyen
*Assistant Examiner* — Yosef Gebreyesus
(74) *Attorney, Agent, or Firm* — McDermott Will & Emery LLP (57) ABSTRACT

Provided is a light emitting diode (LED) package. The LED package includes a package main body, first and second electrode structures, first and second LED chips, and first and second resin packing parts. The package main body includes a concave portion and a barrier wall dividing the concave portion into at least first and second accommodation recesses. The first and second electrode structures are formed at the package main body and are exposed at bottom surfaces of the first and second accommodation recesses respectively. The first and second LED chips are electrically connected to the first and second electrode structures are respectively mounted on the bottom surfaces of the first and second accommodation recesses. The first and second resin packing parts include at least one fluorescent material and are formed in the first and second accommodation recesses for packing the first and second LED chips.

15 Claims, 6 Drawing Sheets

LIGHT EMITTING DIODE PACKAGE

CROSS-REFERENCE TO RELATED APPLICATIONS

This application claims the priority of Korean Patent Application No. 2008-0119189 filed on Nov. 27, 2008, in the Korean Intellectual Property Office, the disclosure of which is incorporated herein by reference.

BACKGROUND OF THE INVENTION

1. Field of the Invention

The present invention relates to a light emitting diode (LED) package, and more particularly, to an LED package including a plurality of different (or the same) LED chips and different fluorescent material layers formed at the LED chips according to the characteristics of light emitted from the LED chips for providing light having high intensity and good color rendering characteristics.

2. Description of the Related Art

In general, light emitting diodes (LEDs) are widely used in packaged states for various display devices and as light sources owing to their good monochromic peak wavelengths, good optical efficiency, and small size. Particularly, many efforts have been made to develop LEDs that can be used as a highly efficient and high-power light source of lighting equipment and a backlight of a display device.

Figure 1:
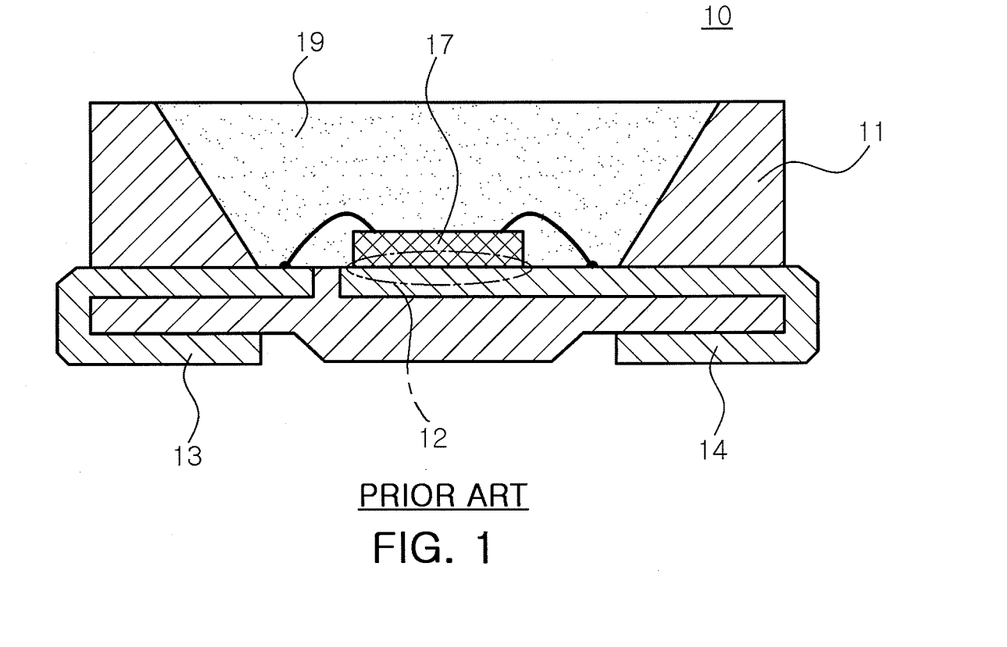
FIG. 1 is a cross-sectional view illustrating an LED package of the related art.

FIG. 1 is a cross-sectional view illustrating an LED package 10 of the related art.

Referring to FIG. 1, the LED package 10 of the related art includes a package body 11 and a LED chip 17. The package body 11 includes a mounting part 12 for mounting the LED chip 17 thereon, and a reflective surface 15 formed on a sidewall surrounding the mounting part 12. Lead electrodes 13 and 14 are arranged on the bottom of the mounting part 12. The LED chip 17 disposed in the LED package 10 may be electrically connected to the lead electrodes 13 and 14 using wires. The LED chip 17 is sealed with a resin packing part 19 formed of a resin such as an epoxy resin and a silicon resin.

In a most common method for constituting a white light emitting device using an LED, a yellow fluorescent material is applied to a blue LED chip. To obtain light having a desired wavelength such as white light using a yellow fluorescent material as described above, fluorescent material particles are dispersed in the resin packing part 19. For example, the resin packing part 19 may be formed by dispersing a yellow fluorescent material containing yttrium aluminum garnet (YAG) into a silicon resin.

Besides the yellow fluorescent material containing YAG, other fluorescent materials containing terbium aluminum garnet (TAG) or silicate can be used. Particularly, YAG or TAG containing materials are good fluorescent materials using the light emitting characteristics of cerium (Ce) and blue light as excitation light.

Although bright (or intensive) light can be obtained using such a blue LED chip coated with a yellow fluorescent material, the color rendering characteristics of the LED chip are poor.

SUMMARY OF THE INVENTION

An aspect of the present invention provides a light emitting diode (LED) package capable of emitting light having high intensity and good color rendering characteristics.

According to an aspect of the present invention, there is provided an LED package including: a package main body including a concave portion and a barrier wall dividing the concave portion into at least first and second accommodation recesses; first and second electrode structures formed at the package main body and exposed at bottom surfaces of the first and second accommodation recesses, respectively; first and second LED chips electrically connected to the first and second electrode structures, the first and second LED chips being mounted on the bottom surfaces of the first and second accommodation recesses, respectively; and first and second resin packing parts comprising at least one fluorescent material and formed in the first and second accommodation recesses for packing the first and second LED chips.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 2:
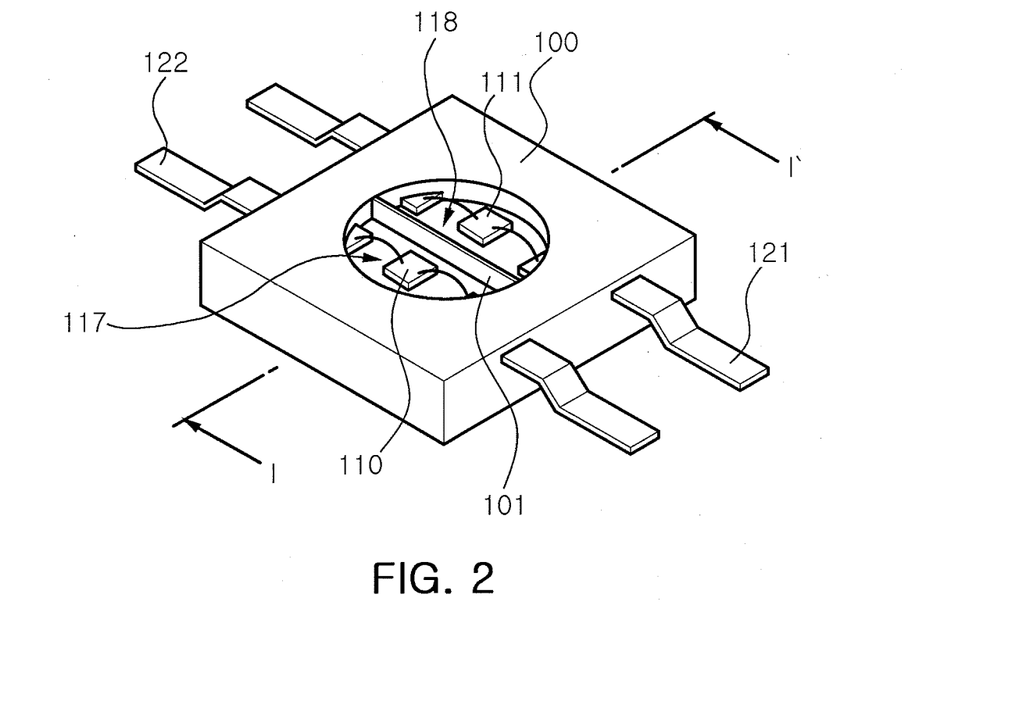
FIG. 2 illustrates a light emitting diode (LED) package according to an embodiment of the present invention.

FIG. 2 illustrates a light emitting diode (LED) package according to an embodiment of the present invention.

Referring to FIG. 2, the LED package of the current embodiment includes a package main body 100, first and second electrode structures 121 and 122, a near ultraviolet LED chip 110, a first resin packing part 117, a blue LED chip 111, and a second resin packing part 118. The package main body 100 includes a concave portion and a barrier wall 101 dividing the concave portion into two accommodation recesses. The first and second electrode structures 121 and 122 are formed in the package main body 100 with ends of the first and second electrode structures 121 and 122 being exposed at the bottom sides of the accommodation recesses. The near ultraviolet LED chip 110 is electrically connected to the first and second electrode structures 121 and 122 and mounted on the bottom side of one of the accommodation recesses. The first resin packing part 117 packs the near ultraviolet LED chip 110 and is composed of at least one layer including at least one of red (R), green (G), and blue (B) fluorescent materials. The first resin packing part 117 is formed on the near ultraviolet LED chip 110. The blue LED chip 111 is mounted in the other of the accommodation recesses where the near ultraviolet LED chip 110 is not mounted. The second resin packing part 118 includes a yellow fluorescent material and packs the blue LED chip 111. The second resin packing part 118 forms at least one layer.

The package main body 100 is an exterior frame of the LED package and may be formed of a plastic material by injection molding, and the accommodation recesses are formed at a center portion of the package main body 100 and have opened top sides. As described above, the accommodation recesses are formed by dividing the concave portion of the package main body 100 using the barrier wall 101. The barrier wall 101 has a vertical surface. Alternatively, the barrier wall 101 may have an inclined surface. In this case, the angle between the inclined surface of the barrier wall 101 and the bottom side of the accommodation recess where the LED chip is mounted may be greater than 60 degrees but smaller than 90 degrees for good reflection efficiency. A reflective material may be formed on a sidewall of the accommodation recess and a lateral surface of the barrier wall 101, or the reflective material may be formed on sidewalls of the accommodation recesses and lateral surfaces of the barrier wall 101, so as to reflect light emitted from the near ultraviolet LED chip 110 and/or the blue LED chip 111.

The first and second electrode structures 121 and 122 are disposed at the bottom sides of the accommodation recesses by inserting the first and second electrode structures 121 and 122 from the outside of the package main body 100 or forming the first and second electrode structures 121 and 122 to be exposed at the bottom sides of the accommodation recesses. The first and second electrode structures 121 and 122 are positive (+) and negative (−) electrode structures. The first and second electrode structures 121 and 122 are electrically connected to an external power supply, and thus a voltage can be applied to the first and second electrode structures 121 and 122 from the external power supply.

The near ultraviolet LED chip 110 and/or the blue LED chip 111 are mounted at the accommodation recesses of the package main body 100 (or mounting portions formed at the accommodation recesses of the package main body 100). The near ultraviolet LED chip 110 and/or the blue LED chip 111 may include conductive wires respectively connected to the first and second electrode structures 121 and 122. If the LED chips 110 and 111 are the same kind of LED chip, the conductive wires may be connected to the same first electrode 121 and the same second electrode 122.

The first resin packing part 117 is formed in one of the accommodation recesses of the package main body 100 where the near ultraviolet LED chip 110 is disposed. The first resin packing part 117 includes at least one of R, G, and B fluorescent materials and may be formed in various shapes.

In other words, in the current embodiment, one of the two LED chips is the near ultraviolet LED chip 110, and the first resin packing part 117 of the near ultraviolet LED chip 110 may be composed of a resin layer formed by mixing a resin with at least one of R, G, and B fluorescent materials. Alternatively, the first resin packing part 117 may be formed by covering the near ultraviolet LED chip 110 with an additional transparent resin layer and forming a resin layer mixed with at least one of R, G, and B fluorescent materials on the transparent resin layer.

Alternatively, the first resin packing part 117 may be formed by sequentially stacking resin layers including R, G, and B fluorescent materials, respectively. Alternatively, the first resin packing part 117 may be formed by covering the near ultraviolet LED chip 110 with an additional transparent resin layer and sequentially stacking resin layers respectively including R, G, and B fluorescent materials on the transparent resin layer.

On the other hand, in the case of the other LED chip (that is, the blue LED chip 111), after the blue LED chip 111 is packed, the second resin packing part 118 including a yellow fluorescent material may be formed around the packed blue LED chip 111. Alternatively, the second resin packing part 118 may be formed by covering the blue LED chip 111 with an additional transparent resin layer and forming a resin layer including a yellow fluorescent material on the transparent resin layer.

The second resin packing part 118 may be formed by injecting a resin such as epoxy resin gel including a yttrium aluminum garnet (YAG) based yellow fluorescent material or silicon resin gel including a YAG based yellow fluorescent material into the accommodation recess of the package main body 100 and hardening the resin using ultraviolet (UV) or heat.

Alternatively, both the two chips may be near ultraviolet LED chips 110. In the case, first resin packing parts 117 may be formed at the near ultraviolet LED chips 110, respectively. For example, a first resin packing part 117 including a R fluorescent material may be formed at one of the two near ultraviolet LED chips 110, and a first resin packing part 117 including G and B fluorescent materials may be formed at the other of the two near ultraviolet LED chips 110.

As described above, the first resin packing parts 117 for the two near ultraviolet LED chips 110 may be formed in various manners. For example, the first resin packing parts 117 may be formed in a way of stacking a plurality of resin layers, or stacking a plurality of resin layers after covering the near ultraviolet LED chip 110 with an additional transparent resin layer. This will be described later in more detail.

When resin layers including fluorescent materials are stacked, a resin layer including an R fluorescent material, a resin layer including a G fluorescent material, and a resin layer including a B fluorescent material may be sequentially stacked in this order. The reason for this is that if the energy of light emitted from a lower fluorescent material is large, optical loss generates or desired white light is not obtained because an upper fluorescent material absorbs the energy of light emitted from the lower fluorescent material.

Therefore, in the present invention, the near ultraviolet LED chip 110 is used for good color rendering characteristics, and the first resin packing part 117 is formed in various manners using R, G, and B fluorescent materials for reducing optical loss. In addition, if very bright light is necessary, the blue LED chip 111 is additionally used, and in this case, the second resin packing part 118 including a yellow fluorescent material is formed in a properly modified manner for reducing optical loss.

The LED package of the current embodiment may further include a lens enclosing the accommodation recesses and fixed to the package main body 100. The lens protects the first and second resin packing parts 117 and 118 formed in the accommodation recesses of the package main body 100. Furthermore, the lens mixes light emitted from the near ultraviolet LED chip 110 or the blue LED chip 111 to condense or diffuse the light in an irregular manner.

More detailed descriptions will now be given with reference to the accompanying drawings.

FIGS. 3(a) to 3(d) illustrate the cases where near ultraviolet LED chips are mounted in both the two accommodation recesses illustrated in FIG. 2, for providing light having good color rendering characteristics and high intensity.

Figure 3A:
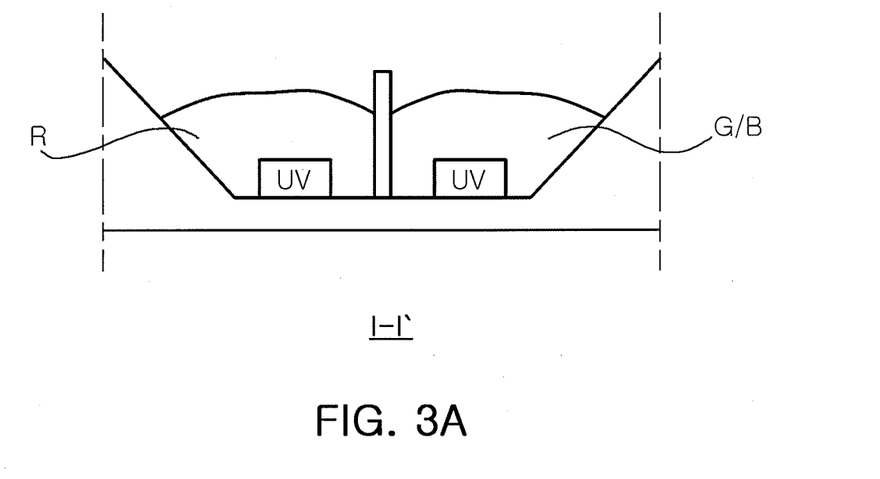
FIGS. 3(a) to 3(d) illustrate the cases where near ultraviolet LED chips are mounted in both the two accommodation recesses illustrated in FIG. 2, for providing light having good color rendering characteristics and high intensity.

As shown in FIGS. 3(a) to 3(d), first resin packing parts may be formed at the near ultraviolet LED chips in various manners as described above. Referring to FIG. 3(a), two near ultraviolet LED chips are grouped into one, and R, G, and B fluorescent materials are provided to the grouped near ultraviolet LED chips for obtaining white light from the grouped near ultraviolet LED chips. On the other hand, referring to FIGS. 3(b) to 3(d), a layer in which R, G, and B fluorescent materials are mixed, or stacked R, G, and B fluorescent material layers are provided to each of near ultraviolet LED chips for obtaining white light from each of the near ultraviolet LED chips.

In more detail, as shown in FIG. 3(a), if a first resin packing part including an R fluorescent material is formed on one of the grouped two near ultraviolet LED chips, another first resin packing part composed of a layer in which G and B fluorescent materials are mixed may be formed on the other of the grouped two near ultraviolet LED chips.

Although not shown in FIG. 3(a), the first resin packing parts may include additional transparent resin layers, respectively, in which the near ultraviolet LED chips are buried. In addition, the first resin packing part including G and B fluorescent materials may be formed by stacking G and B fluorescent material layers on the transparent resin layer or disposing a layer including G and B fluorescent materials on the transparent resin layer.

Figure 3B:
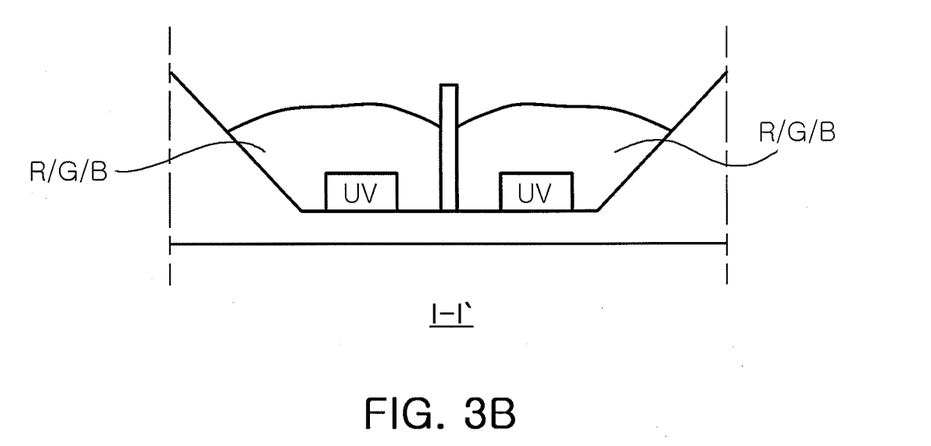

Referring to FIG. 3(b), first resin packing parts each composed of a layer in which R, G, and B fluorescent materials are mixed are formed on the near ultraviolet LED chips, respectively.

In the case, the first resin packing part may include an additional transparent resin layer in which the near ultraviolet LED chip is buried.

Figure 3C:
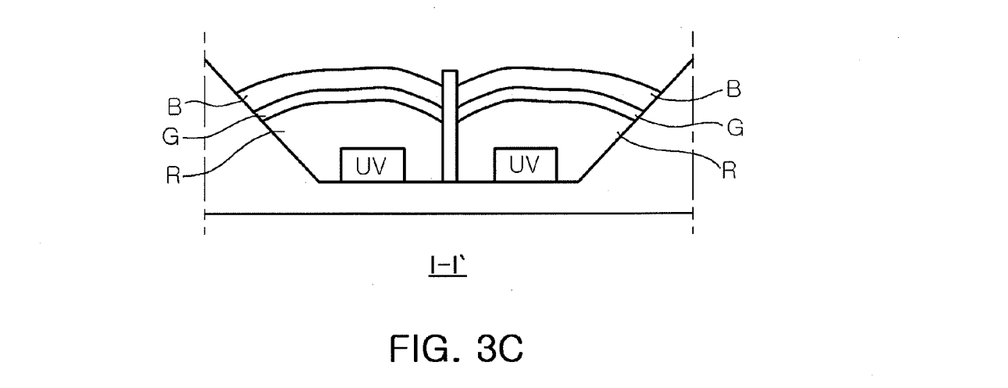

Referring to FIG. 3(c), a first resin packing part in which R, G, and B fluorescent material layers are sequentially stacked is formed on each of the near ultraviolet LED chips.

Figure 3D:
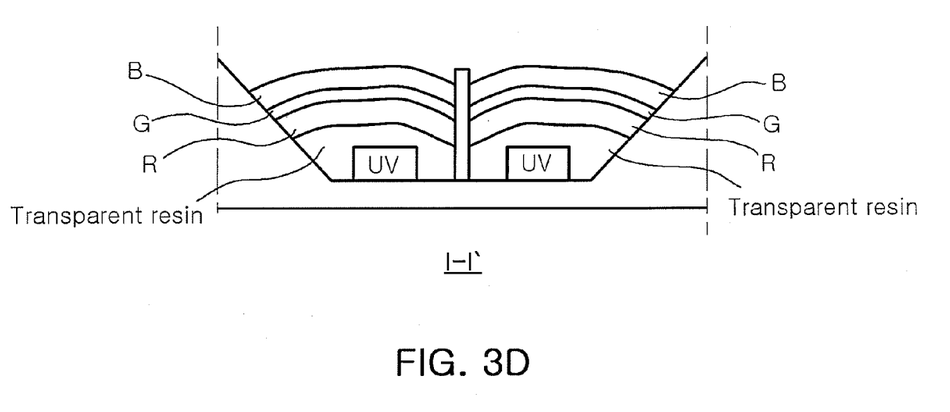

As shown in FIG. 3(d), the first resin packing part of FIG. 3(c) may include an additional transparent resin layer in which the near ultraviolet LED chip is buried.

According to the present invention, when LED chips emitting light having the same wavelength or optical characteristics are mounted in neighboring accommodation recesses, the characteristics of a barrier wall disposed between the LED chips may be varied according to the optical conversion structure (that is, the structure of the resin packing parts).

For example, in the cases of FIGS. 3(a) and 3(b), light emitted from the near ultraviolet LED chips may be transmitted through the barrier wall, and light mixed by the optical conversion layers (that is, the first resin packing parts) may be transmitted through the barrier wall.

However, in the cases of FIG. 3(c) and 3(d) where the optical conversion layers (that is, the first resin packing parts) have stacked structures, although light emitted from the near ultraviolet LED chips may be transmitted through the barrier wall, light converted by at least one of R, G, and B fluorescent material layers may not be transmitted through the barrier wall.

For this, a wavelength selective coating may be formed on the barrier wall for transmitting light having a specific wavelength, or a reflective coating may be formed on the barrier wall for reflecting light having a specific wavelength.

Figure 4A:
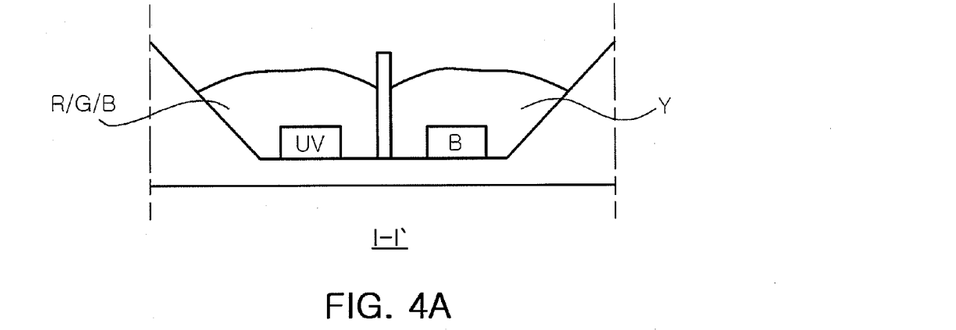
FIGS. 4(a) to 4(c) illustrate the cases where one of the two LED chips illustrated in FIG. 2 is configured by a near ultraviolet LED chip and the other is configured by a blue LED chip for providing light having good color rendering characteristics and high intensity.
Figure 4B:
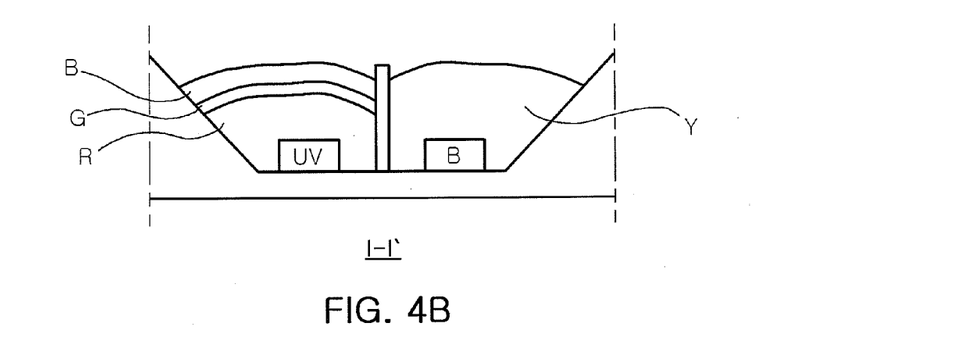
Figure 4C:
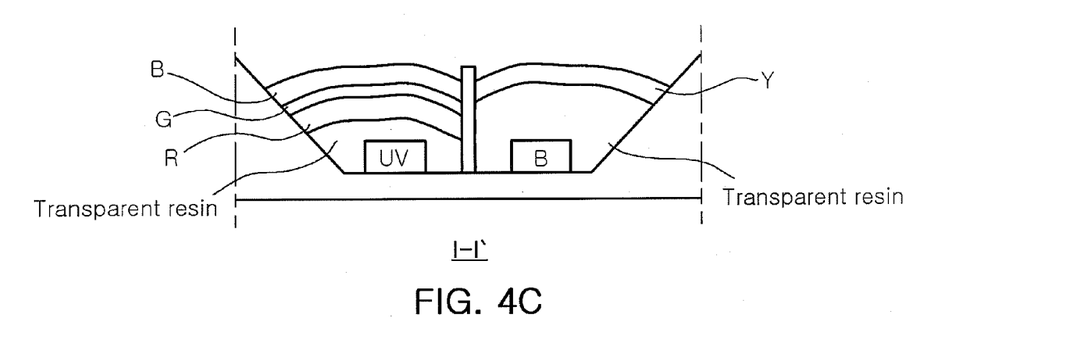

FIGS. 4(a) to 4(c) illustrate the cases where one of the two LED chips illustrated in FIG. 2 is configured by a near ultraviolet LED chip and the other is configured by a blue LED chip for providing light having good color rendering characteristics and high intensity.

FIG. 4(a) illustrates first and second resin packing parts formed for providing light having good color rendering characteristics and high intensity. That is, the first resin packing part formed on a near ultraviolet LED chip is composed of a single layer in which R, G, and B fluorescent materials are mixed, and the second resin packing part formed on a blue LED chip is composed of a single layer in which a yellow fluorescent material is mixed.

However, if R, G, and B fluorescent materials are mixed in a single layer, high-energy light is absorbed by other fluorescent materials, and thus color rendering characteristics can be deteriorated.

FIG. 4(b) illustrates an improved structure as compared with the structure illustrated in FIG. 4(a). A first resin packing part formed on a near ultraviolet LED chip is composed of stacked resin layers respectively including R, G, and B fluorescent materials, and a second resin packing part formed on a blue LED chip is composed of a single layer in which a yellow fluorescent material is mixed. That is, a fluorescent material providing light having higher energy is disposed at a higher position so that white light having good rendering characteristics can be provided.

In the structure illustrating in FIG. 4(b), however, the resin layer including an R fluorescent material occupies a relatively large area in the first resin packing part, and thus it may be difficult to obtain desired ideal color rendering characteristics.

FIG. 4(c) illustrates an improved structure as compared with the structure illustrated in FIG. 4(b). A first resin packing part formed on a near ultraviolet LED chip is composed of an additional transparent resin layer in which the near ultraviolet LED chip is buried and R, G, and fluorescent material layers stacked on the transparent resin layer. Since R, G, and B fluorescent materials are uniformly arranged, ideal color rendering characteristics can be obtained. Similarly, a second resin packing part formed on a blue LED chip may be composed of an additional transparent resin layer in which the blue LED chip is buried and a yellow fluorescent material layer formed on the transparent resin layer.

In the structure illustrating in FIG. 4(a), light emitted from the different LED chips may not be transmitted through a barrier wall disposed between the LED chips; however, light mixed at the light conversion layers (that is, the first and second resin packing parts) may be transmitted through the barrier wall.

In the stacked structures illustrated in FIGS. 4(b) and 4(c), light emitted from the different LED chips may not be transmitted through a barrier wall disposed between the LED chips, and light mixed at at least one of R, G, and B fluorescent material layers may not be transmitted through the barrier wall.

For this, as explained above, a wavelength selective coating may be formed on the barrier wall for transmitting light having a specific wavelength, or a reflective coating may be formed on the barrier wall for reflecting light having a specific wavelength.

Figure 5:
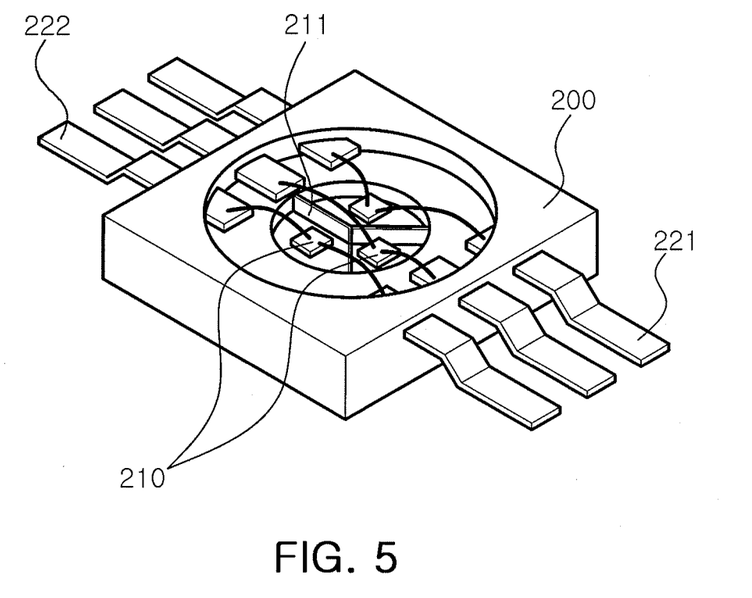
FIG. 5 illustrates an LED package according to another embodiment of the present invention.

FIG. 5 illustrates an LED package according to another embodiment of the present invention.

Referring to FIG. 5, the LED package of the current embodiment includes a package main body 200, first and second electrode structures 221 and 222, a near ultraviolet and/or blue LED chip 210, a first resin packing part, a blue LED chip 210, and a second resin packing part. The package main body 200 includes a concave portion and a barrier wall 211 dividing the concave portion into three accommodation recesses. The first and second electrode structures 221 and 222 are formed in the package main body 200 with ends of the first and second electrode structures 221 and 222 being exposed at the bottom sides of the accommodation recesses. The near ultraviolet and/or blue LED chip 210 is electrically connected to the first and second electrode structures 221 and 222 and mounted on the bottom side of at least one of the accommodation recesses. The first resin packing part packs the near ultraviolet and/or blue LED chip 210 and is composed of at least one layer including at least one of red (R), green (G), and blue (B) fluorescent materials. The first resin packing part is formed on the near ultraviolet and/or blue LED chip 210. When there remains at least one accommodation recess where the near ultraviolet and/or blue LED chip 210 is not mounted, the blue LED chip 210 is mounted in the remaining accommodation recess. The second resin packing part includes a yellow fluorescent material and packs the blue LED chip 111. The second resin packing part 118 forms at least one layer.

In the current embodiment, various chip arrangements are possible. For example, near ultraviolet LED chips may be mounted in all the three accommodation recesses. In another example, near ultraviolet LED chips may be mounted in two of the three accommodation recesses, and a blue LED chip may be mounted in the remaining one of the three accommodation recesses. In anther example, blue LED chips may be mounted in all the three accommodation recesses.

In the examples, resin packing parts may be formed on the LED chips in manners similar to the above-described manners. However, the resin packing parts can be formed in another manner. In the example where near ultraviolet LED chips are mounted in all the three accommodation recesses, for instance, first resin packing parts respectively including R, G, and B fluorescent materials may be formed on the near ultraviolet LED chips, respectively. This structure is explained as an exemplary structure for providing ideal white light.

Except for those described above, the current embodiment is substantially the same as the above-described embodiments. Thus, descriptions of other parts of the current embodiment will be omitted.

In the embodiments illustrated in FIGS. 1 and 5, the accommodation recesses and the barrier wall of the package main body can be modified in various forms.

Figure 6A:
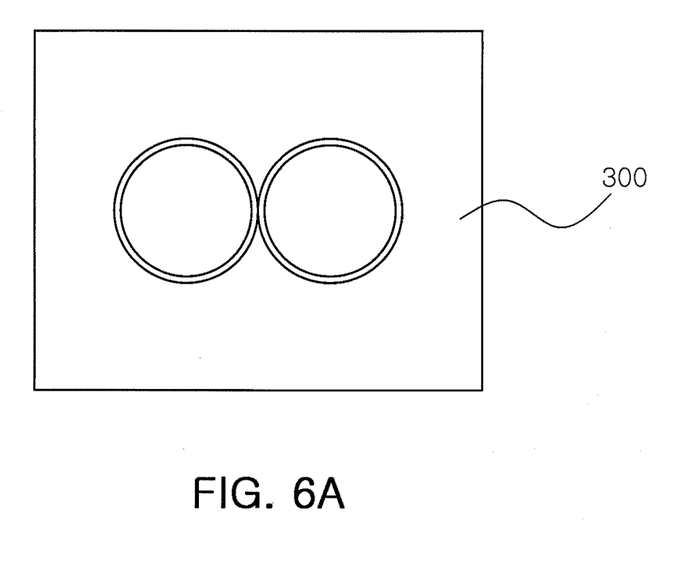
FIGS. 6A and 6B are plan views illustrating exemplary accommodation recesses of package main bodies according to embodiments of the present invention.
Figure 6B:
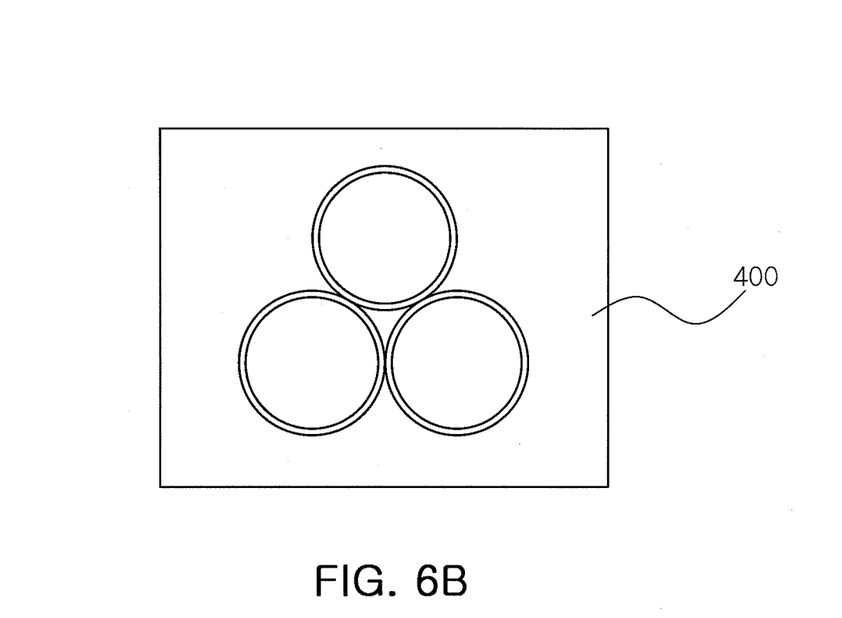

FIGS. 6A and 6B are plan views illustrating exemplary accommodation recesses of package main bodies according to embodiments of the present invention.

Referring to FIGS. 6(a) and 6(b), circular accommodation recesses are closely formed in package main bodies 300 and 400, and barrier walls are formed between the circular accommodation recesses. Although not shown in FIGS. 6(a) and 6(b), sidewalls of the circular accommodation recesses may be sloped, and a reflective material may be applied to the sidewalls, so as to increase the amount of light reflected by the sidewalls of the accommodation recesses.

Figure 7:
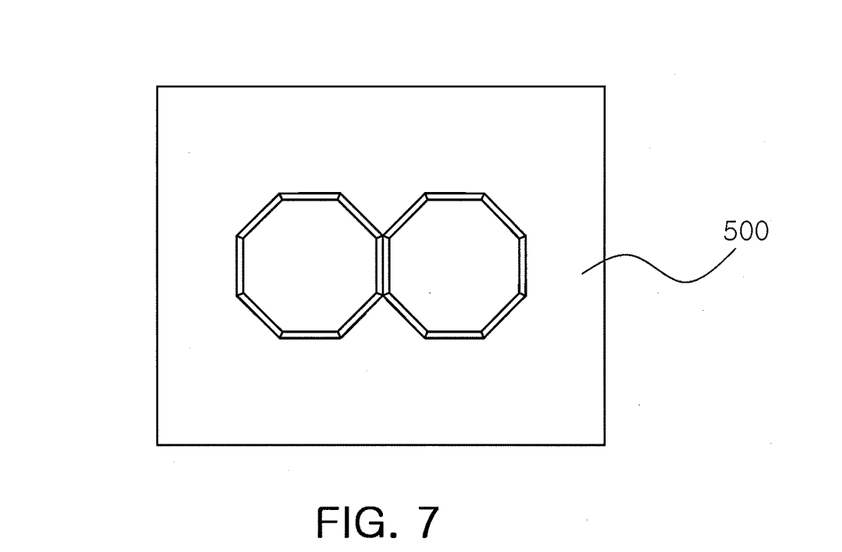
FIG. 7 is a plan view illustrating exemplary accommodation recesses of a package main body according to another embodiment.

FIG. 7 is a plan view illustrating exemplary accommodation recesses of a package main body according to another embodiment.

Referring to FIG. 7, polygonal accommodation recesses are closely formed in a package main body 500, and a barrier wall is formed between the close accommodation recesses. Similarly, sidewalls of the circular accommodation recesses may be sloped, and a reflective material may be applied to the sidewalls, so as to increase the amount of light reflected by the sidewalls of the accommodation recesses.

In the case where accommodation recesses having the same shape are provided as illustrated in FIGS. 6(a), 6(b), and 7, a lens covering all the accommodation recesses may also be provided.

According to the present invention, the LED package provides bright and intensive white light having good color rendering characteristics.

While the present invention has been shown and described in connection with the exemplary embodiments, it will be apparent to those skilled in the art that modifications and variations can be made without departing from the spirit and scope of the invention. For example, an LED package including only ultraviolet (or near ultraviolet) chips may be modified to include both ultraviolet and violet chips or only violet chips.

Thus, the exemplary embodiments and the accompanying drawings should be considered in descriptive sense only and not for purposes of limitation, and the scope and spirit of the present invention should be defined by the following claims.

What is claimed is:

1. Alight emitting diode (LED) package comprising:
a package main body having a concave portion and a barrier wall dividing the concave portion into at least first and second two accommodation recesses;
first and second electrode structures formed at the package main body and exposed at bottom surfaces of the first and second accommodation recesses, respectively;
first and second LED chips being electrically connected to the first and second electrode structures, and being mounted on the bottom surfaces of the first and second accommodation recesses, respectively; and
first and second resin packing parts including at least one fluorescent material and being formed in the first and second accommodation recesses for packing the first and second LED chips,
wherein the barrier wall has a wavelength selective permeability for transmitting light generated by at least one of the first and second LED chips and not transmitting at least one light converted by the fluorescent material.

2. The LED package of claim 1, wherein the first and second LED chips are near ultraviolet LED chips.

3. The LED package of claim 2, wherein the first resin packing part formed in the first accommodation recess for packing the first LED chip includes a red fluorescent material, and
the second resin packing part formed in the second accommodation recess for packing the second LED chip includes green and blue fluorescent materials.

4. The LED package of claim 2, wherein the first and second resin packing parts formed in the first and second accommodation recesses for packing the first and second LED chips are formed by mixing red, green, and blue fluorescent materials.

5. The LED package of claim 2, wherein the first and second resin packing parts formed in the first and second accommodation recesses for packing the first and second LED chips are formed by sequentially stacking and including red, green, and blue fluorescent materials respectively.

6. The LED package of claim 2, wherein at least one of the first and second resin packing parts formed in the first and second accommodation recesses for packing the first and second LED chips further comprises:
a transparent resin layer in which the first or second LED chip is buried; and
red, green, and blue fluorescent materials sequentially stacked on the transparent resin layer.

7. The LED package of claim 1, the first and second LED chips have different emitting wavelength.

8. The LED package of claim 7, wherein the first LED chip is a near ultraviolet LED chip, and the second LED chip is a blue LED chip.

9. The LED package of claim 8, wherein the first resin packing part formed in the first accommodation recess for packing the first LED chip is formed by mixing red, green, and blue fluorescent materials, and the second resin packing part formed in the second accommodation recess for packing the second LED chip includes a yellow fluorescent material.

10. The LED package of claim 8, wherein the first resin packing part formed in the first accommodation recess for packing the first LED chip is formed by sequentially stacking and including red, green, and blue fluorescent materials respectively, and the second resin packing part formed in the second accommodation recess for packing the second LED chip includes a yellow fluorescent material.

11. The LED package of claim 8, wherein the first resin packing part formed in the first accommodation recess for packing the first LED chip includes:

a transparent resin layer in which the first LED chip is buried; and red, green, and blue fluorescent materials mixed on the transparent resin layer, and the second resin packing part formed in the second accommodation recess for packing the second LED chip includes:

a transparent resin layer in which the second LED chip is buried; and a yellow fluorescent material formed on the transparent resin layer.

12. The LED package of claim 8, wherein the first resin packing part formed in the first accommodation recess for packing the first LED chip includes:

a transparent resin layer in which the first LED chip is buried; and red, green, and blue fluorescent materials sequentially stacked on the transparent resin layer, and the second resin packing part formed in the second accommodation recess for packing the second LED chip includes a transparent resin layer in which the second LED chip is buried; and a yellow fluorescent material formed on the transparent resin layer.

13. The LED package of claim 1, wherein the barrier wall has a wavelength selective permeability coating for transmitting light generated by the at least one of the first and second LED chips.

14. The LED package of claim 1, wherein the barrier wall as a selectively reflective coating for reflecting light having for reflecting the at least one light converted by the fluorescent material.

15. The LED package of claim 1, wherein the package body further comprises at least one third accommodation recess and the first , second and third accommodation recesses are disposed symmetrically with respect to any one point on the package body.

* * * * *

UNITED STATES PATENT AND TRADEMARK OFFICE
CERTIFICATE OF CORRECTION

| | |
|---|---|
| PATENT NO. | : 8,558,268 B2 |
| APPLICATION NO. | : 12/343452 |
| DATED | : October 15, 2013 |
| INVENTOR(S) | : Hyung Kun Kim et al. |

It is certified that error appears in the above-identified patent and that said Letters Patent is hereby corrected as shown below:

IN THE CLAIMS:

In Column 10, Line 20

Replace "as", with --has--.

Signed and Sealed this
Third Day of June, 2014

Michelle K. Lee
*Deputy Director of the United States Patent and Trademark Office*